United States Patent
Chee et al.

(10) Patent No.: US 11,959,559 B2
(45) Date of Patent: Apr. 16, 2024

(54) VALVE CONTROL DEVICE, DRIVE CONTROL DEVICE, AND FLUID CONTROL DEVICE

(71) Applicant: Mechano Transformer Corporation, Tokyo (JP)

(72) Inventors: Sze Keat Chee, Tokyo (JP); Takeshi Yano, Tokyo (JP); Akio Yano, Tokyo (JP)

(73) Assignee: MECHANO TRANSFORMER CORPORATION, Tokyo (JP)

( * ) Notice: Subject to any disclaimer, the term of this patent is extended or adjusted under 35 U.S.C. 154(b) by 250 days.

(21) Appl. No.: 17/312,477

(22) PCT Filed: Nov. 19, 2019

(86) PCT No.: PCT/JP2019/045190
§ 371 (c)(1),
(2) Date: Jun. 10, 2021

(87) PCT Pub. No.: WO2020/121747
PCT Pub. Date: Jun. 18, 2020

(65) Prior Publication Data
US 2022/0057011 A1    Feb. 24, 2022

(30) Foreign Application Priority Data

Dec. 14, 2018    (JP) .................................. 2018-234852

(51) Int. Cl.
*F16K 31/00*  (2006.01)
*F16K 1/38*   (2006.01)
*H02N 2/00*   (2006.01)

(52) U.S. Cl.
CPC ............ *F16K 31/004* (2013.01); *F16K 1/385* (2013.01); *H02N 2/0075* (2013.01)

(58) Field of Classification Search
CPC ...... F16K 1/385; F16K 31/004; H02N 2/0075
See application file for complete search history.

(56) References Cited

U.S. PATENT DOCUMENTS

| 6,230,738 B1 | 5/2001 | Watanabe et al. |
| 9,829,862 B2 | 11/2017 | Takenawa |
| (Continued) | | |

FOREIGN PATENT DOCUMENTS

| CN | 104426421 A | 3/2015 |
| JP | H03-092525 A | 4/1991 |
| (Continued) | | |

OTHER PUBLICATIONS

Search Report dated Jan. 28, 2020 in International Application No. PCT/JP2019/045190.

(Continued)

*Primary Examiner* — Paul J Gray
(74) *Attorney, Agent, or Firm* — Miles & Stockbridge, P.C.

(57) ABSTRACT

To provide a valve control device, a drive control device, and a fluid control device, which are suitable for adjusting a valve. The valve control device comprises: a rod-shaped rotor provided so as to rotate about a rotation axis, wherein one end of the rotor is directly or indirectly connected to a valve body, at least a part of the valve body being positioned in a flow path for fluid, wherein the rotor changes a relative position between the valve body and a valve seat that is closed by the valve body or a contact force between the valve body and the valve seat; a pair of contacts for sandwiching the rotor and for rotating the rotor; a moving unit comprising a piezoelectric element for causing the pair of contacts to perform relative movement; and a drive control unit for controlling the relative position between the valve body and the valve seat or the contact force between the valve body and the valve seat by applying a voltage (Continued)

waveform having a rising slope and a falling slope different from the rising slope to the piezoelectric element so as to cause the pair of contacts to rotate the rotor in a desired direction, wherein a steeper slope of the rising slope and the falling slope causes a slip between the rotor and the pair of contacts.

19 Claims, 7 Drawing Sheets

(56) References Cited

U.S. PATENT DOCUMENTS

2015/0071042 A1   3/2015  Takenawa
2017/0030474 A1*  2/2017  Ben-Ami .............. F16K 31/004

FOREIGN PATENT DOCUMENTS

| JP | H0392525 A | 4/1991 |
| JP | H08-197966 A | 8/1996 |
| JP | 2001-012632 A | 1/2001 |
| JP | 200112632 A | 1/2001 |
| JP | WO2006064865 A1 | 6/2008 |
| JP | 2011043196 A | 3/2011 |
| JP | 2015-053789 A | 3/2015 |
| JP | 201553789 A | 3/2015 |

OTHER PUBLICATIONS

Written Opinion dated Jan. 28, 2020 in International Application No. PCT/JP2019/045190.
Office Action dated Jun. 28, 2022 in Japanese Application No. 2018-234852.
Office Action dated Dec. 6, 2023 in Korean Application No. 10-2023-7015730.

* cited by examiner (b)

(a)

Fig.2
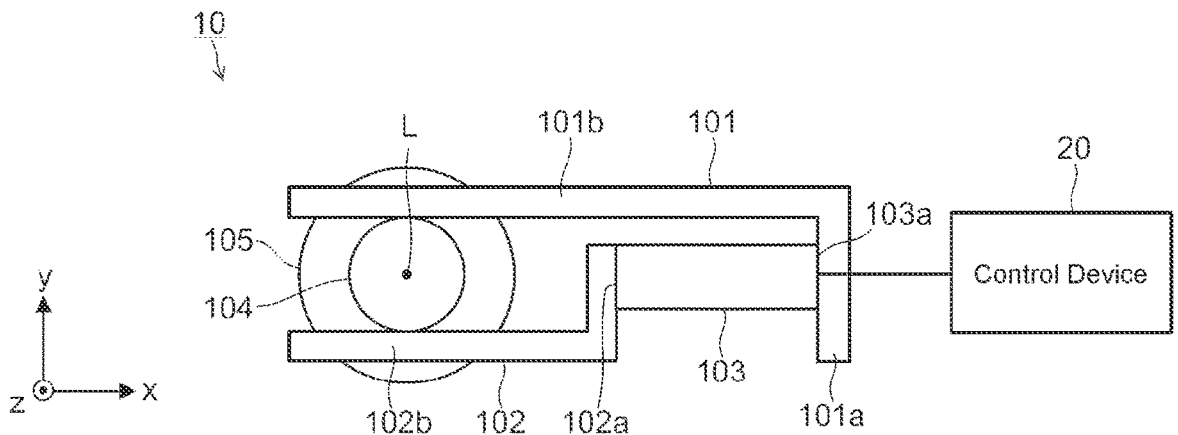
Fig.3A
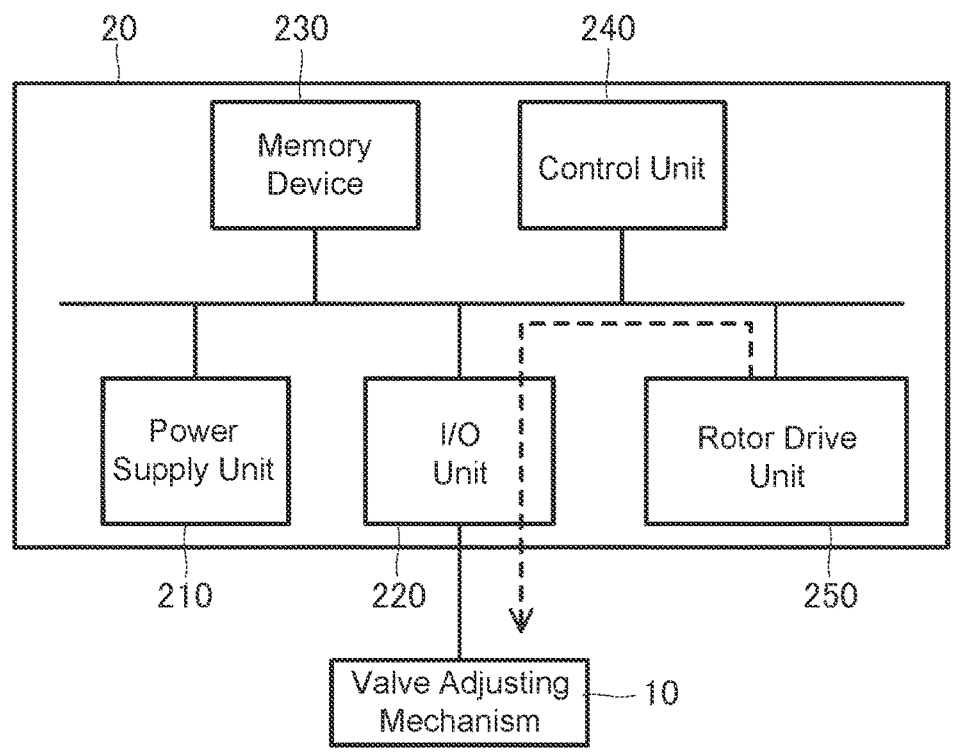
Fig.3B
| Number of Drives [number] | Amount of Rotation [rad] | Amount of Control Target [m³/s] |
|---|---|---|

VALVE CONTROL DEVICE, DRIVE CONTROL DEVICE, AND FLUID CONTROL DEVICE

FIELD OF THE INVENTION

The present invention relates to a valve control device, a drive control device and a fluid control device for controlling valves used for adjusting a fluid flowing through a flow path.

BACKGROUND ART

Conventionally, adjusting devices (for example, a speed controller or a regulator) for adjusting a flow rate, a flow velocity, or a pressure of a fluid flowing through a flow path has been known (for example, see Patent Literature 1).

Such an adjusting device is provided with a valve, the flow rate and flow velocity and the pressure of the fluid is adjusted by the operator who adjusts the opening of the valve.

CITATION LIST

Patent Literature

Patent Literature 1: JP2011-043196A

SUMMARY OF THE INVENTION

Technical Problem

When the operator tightens with the fixing nut so that the position of the valve is fixed at the end of the adjustment operation, the fixing nut is slightly deviated from the tightening position by backlash (also referred to as backlash, so-called play), the valve may deviate from the adjusted position corresponding thereto. Due to so-called backlash), the fixing nut may be slightly displaced from the tightening position, and the valve may be displaced from the adjusted position in response to this. As a result, the adjustment accuracy of the valve may be lowered.

The present invention has been made to solve the above problems, and an object of the present invention is to provide a valve control device suitable for valve adjustment.

Solution to Problem

In order to solve the above problems, a valve control device according to an embodiment of the present invention comprises: a rod-shaped rotor provided so as to rotate about a rotation axis, wherein one end of the rotor is directly or indirectly connected to a valve body, at least a part of the valve body being positioned in a flow path for fluid, wherein rotation of the rotor changes a relative position between the valve body and a valve seat that is closed by the valve body or a contact force between the valve body and the valve seat; a pair of contacts for sandwiching the rotor, wherein relative movement of the pair of contacts rotates the rotor; a moving unit comprising a piezoelectric element for causing the pair of contacts to perform relative movement; and a drive control unit for controlling the relative position between the valve body and the valve seat or the contact force between the valve body and the valve seat by applying a voltage waveform having a rising slope and a falling slope different from the rising slope to the piezoelectric element so as to cause the rotor to rotate in a desired direction, wherein a gentler slope of the rising slope and the falling slope causes the pair of contacts to rotate the rotor, and a steeper slope of the rising slope and the falling slope causes a slip between the rotor and the pair of contacts.

Advantageous Effect of the Invention

According to the present invention, it is possible to provide a valve control device, a drive control device, and a fluid control device suitable for valve adjustment.

BRIEF DESCRIPTION OF THE DRAWINGS

FIG. 2 schematically shows a configuration of the valve adjusting mechanism.

FIG. 3A is a diagram showing the configuration of the control unit.

FIG. 3B is a conceptual diagram showing the conversion table TB.

DESCRIPTION OF EMBODIMENTS

First Embodiment

Figure 1:
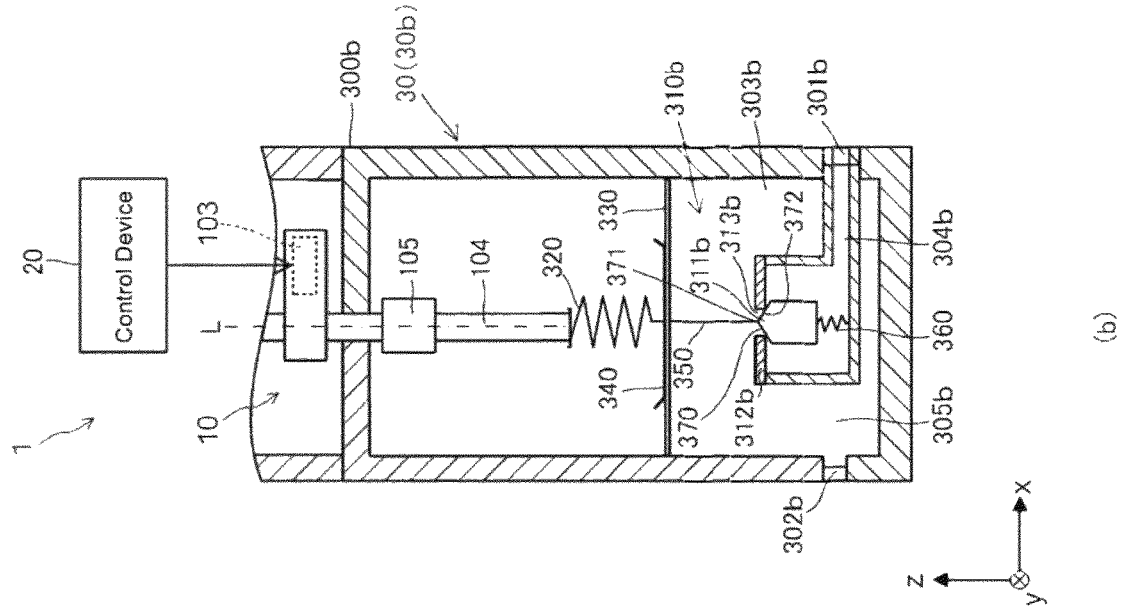
FIG. 1 is a diagram of the valve control device according to the first embodiment.
Figure 1:
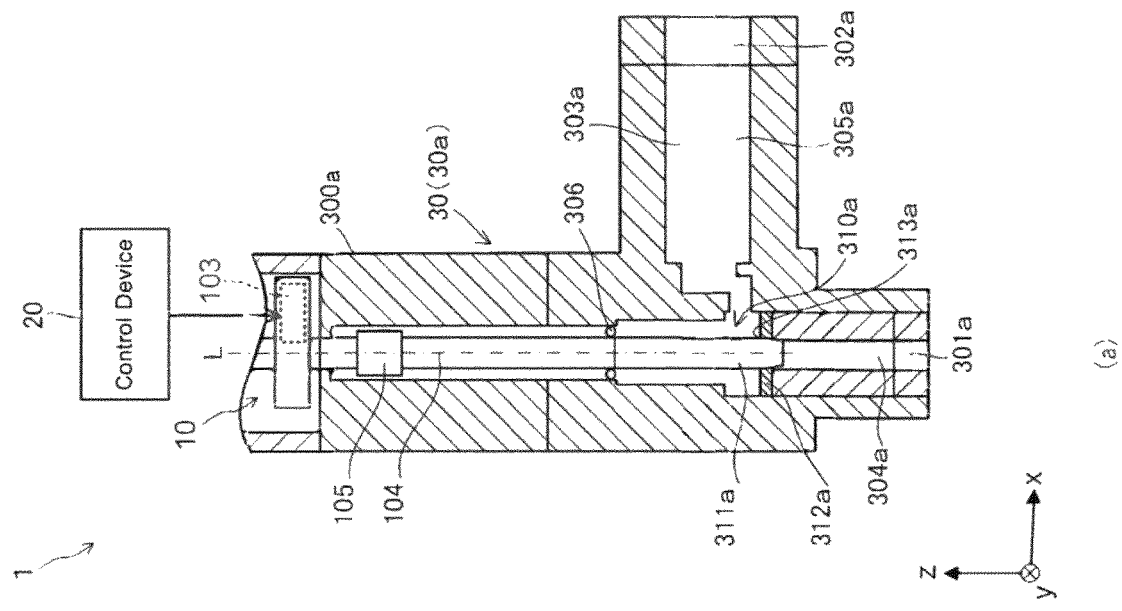

Hereinafter, the first embodiment of the present invention will be described with reference to the drawings. FIG. 1 is a configuration diagram of the valve control device 1 according to the first embodiment. More specifically, FIG. 1(a) is a configuration diagram of a valve control device 1 that controls a fluid adjusting device 30 (as one example, a speed controller (flow rate adjusting valve)), and FIG. 1(b) is a configuration diagram of a valve control device 1 that controls a fluid adjusting device 30 (as one example, a regulator (pressure reducing valve)). FIG. 2 schematically shows a configuration of the valve adjusting mechanism 10, the valve adjusting mechanism 10 is viewed in a plan view from above, and the control device 20 is schematically shown.

In FIGS. 1 and 2, the coordinate axes of x, y, and z that are orthogonal to each other are shown. With these coordinate axes, the direction can be known, for example, with reference to FIG. 2. As schematically shown in FIG. 2, when the valve adjusting mechanism 10 (also referred to as a piezoelectric inertial rotation mechanism) is viewed from above in a plan view, the longitudinal direction of the contact 101 and the contact 102, which are a pair of contacts, is the x-axis direction (also referred to as the width direction), the front-rear direction is the y-axis direction (also referred to as the depth direction), and the height direction is the z-axis direction (also referred to as the vertical direction). In addition, an "x" in the "○" in the drawings (for example, the y-axis in FIG. 1) means an arrow pointing from the front to the back of the drawings, a small "●" in the "○"

in the drawings (for example, the z-axis in FIG. 2) means an arrow from the back to the front of the drawings.

The "flow path" described below is also referred to as a fluid passage, and refers to a path through which a fluid (gas or liquid, also referred to as a pressure fluid) flows. The fluid adjusting device 30 (speed controller 30a or regulator 30b) described below is arranged at a predetermined position in the flow path, the first port 301a or the first port 301b, the second port 302a or the second port 302b, the passage 303a or the passage 303b included in the speed controller 30a or the regulator 30b communicate with the flow path and function as a part of the flow path.

Moreover, "opening/closing of the valve portion 310a" and "opening/closing of the valve portion 310b" described below indicate that the valve body 311a and the valve body 311b are controlled as intended, more specifically, refer to "the relative position of the valve body 311a included in the valve portion 310a and the valve seat 312a closed by the valve body 311a is variable", or to "the contact force between the valve body 311b and the valve seat 312b is variable". In "opening and closing of valve portion 310a", "as a result of variable relative positions of the valve body 311a (or valve body 311b) and valve seat 312a (or valve seat 312b), the contact force between the valve body 311a (or valve body 311b) and the valve seat 312a (or valve seat 312b) is variable" is also included.

Furthermore, in the following description, the rotor 104 rotates forward or backward to move forward and backward in the z-axis direction. However, here, "forward rotation" is clockwise when the valve adjusting mechanism 10 is viewed in a plan view from above as shown in FIG. 2, and refers to rotation in the direction of closing the valve portion 310a (or valve portion 310b). "Reverse rotation" is counterclockwise when the valve adjusting mechanism 10 is viewed in a plan view from above as shown in FIG. 2, and refers to rotation in the direction of opening the valve portion 310a (or valve portion 310b).

Furthermore, the "direct connection" described below means, for example, that the valve body 311a and the rotor 104 included in the valve adjusting mechanism 10 are integrally formed, or that a state in which the valve body 311a and the rotor 104 are connected so as to be in direct contact with each other.

The "indirect connection" refers to, for example, a state in which the valve body 311b and the rotor 104 in a spatially separated state are connected to each other via a predetermined member.

As shown in FIG. 1, the valve control device 1 includes at least a valve adjusting mechanism 10 and a control device 20 (drive control device). The valve control device 1 is a device in which the valve adjusting mechanism 10 whose drive is controlled by the control device 20 opens and closes a valve in the fluid adjusting device 30, and as a result, at least one of the flow rate, the flow velocity, and the pressure of the fluid is adjusted.

In the first embodiment, the fluid adjusting device 30 is a control target by the control device 1, and is not included in the valve control device 1, but the fluid adjusting device 30 may be included in the valve control device 1.

The fluid adjusting device 30 is not limited to the speed controller 30a and the regulator 30b, and various devices such as a throttle valve are applicable as long as at least one of the flow rate, the flow velocity and the pressure of the fluid can be adjusted.

(Speed Controller 30a)

As shown in FIG. 1(a), the speed controller 30a includes at least a main body 300a and a valve portion 310a. Various configurations and shape variations of the speed controller 30a are known, and the configuration and shape of the speed controller 30a are not limited to the configuration and shape shown in FIG. 1.

The main body 300a is formed with a first port 301a, a second port 302a, and a passage 303a communicating with these.

The valve portion 310a includes a valve body 311a and a valve seat 312a. The valve portion 310a is, for example, a needle valve. The valve portion 310a divides the passage 303a into a first passage 304a and a second passage 305a with the valve seat 312a as a boundary. An O-ring 306 is provided at a predetermined portion of the passage 303a to prevent the fluid from flowing into an unnecessary portion.

The valve body 311a is formed in a needle shape, one end side is directly connected to one end side of the rotor 104 provided in the valve adjusting mechanism 10, and the end opposite to this one end side closes the valve seat 312a.

Yet, in the speed controller 30a shown in FIG. 1, the valve body 311a is directly connected to one end side of the rotor 104, but may be indirectly connected.

In the speed controller 30a configured as described above, the rotor 104 of the valve adjusting mechanism 10 rotates and moves in the z-axis direction (axis L direction), so that the valve body 311a also moves in the z-axis direction to close or release the closure of the hole 313a of the valve seat 312a (that is, the valve portion 310a is opened and closed). The rotation of the rotor 104 will be described later.

By opening and closing the valve portion 310a, a fluid flows from the first passage 304a toward the second passage 305a. At this time, the flow rate of the fluid is adjusted by the opening degree of the valve portion 310a. On the contrary, the fluid may flow from the second passage 305a toward the first passage 304a.

(Regulator 30b)

As shown in FIG. 1(b), the regulator 30b includes at least a main body 300b, a valve portion 310b, an adjusting spring 320, a diaphragm 330, a spring tray 340, a connecting rod 350, and a small spring 360. Various variations of the configuration and shape of the regulator 30b are known, and the configuration and shape of the regulator 30b are not limited to the configuration and shape shown in FIG. 1.

The main body 300b includes a first port 301b, a second port 302b, and a passage 303b communicating with them.

The valve portion 310b includes a valve body 311b and a valve seat 312b. The valve portion 310b divides the passage 303b into a first passage 304b and a second passage 305b with the valve seat 312b as a boundary.

The valve body 311b is indirectly connected to the rotor 104 via an adjusting spring 320, a diaphragm 330, a spring tray 340, a connecting rod 350, and the like. The valve body 311b is constantly pressed by the small spring 360 in the direction of closing the hole 313b of the valve seat 312b. The valve body 311b is a substantially columnar member having a tip portion 370 formed in a substantially conical shape, a connecting rod 350 is connected to the top portion 371 (connecting portion) thereof, and the inclined surface 372 closes the hole 313b (closed portion).

In the regulator 30b configured as described above, the rotor 104 of the valve adjusting mechanism 10 rotates and moves in the z-axis direction, whereby the diaphragm 330 is pressed via the adjustment spring 320 or the spring tray 340, or this pressing is released. At this time, the valve portion 310b is opened and closed to change the contact force between the valve body 311b and the valve seat 312b, and the fluid pressure is adjusted. As with the speed controller 30a, the fluid flows from the first passage 304b toward the second passage 305b, but on the contrary, it may flow from the second passage 305b toward the first passage 304b.

(Valve Adjusting Mechanism 10)

As shown in FIGS. 2 and 3, the valve adjusting mechanism 10 includes at least a pair of contacts, a contact 101 and a contact 102, a piezoelectric element 103 (moving unit), a rotor 104, and a moment of inertia member 105.

The valve adjusting mechanism 10 is housed in the fluid adjusting device 30. However, a housing dedicated to the valve adjusting mechanism 10 (not shown) may be prepared, and the valve adjusting mechanism 10 may be arranged in the housing and attached to the fluid adjusting device 30 (that is, in an external configuration).

The contact 101 has a substantially L-shape, and its short side portion 101a is attached to the first contact end 103a of the piezoelectric element 103. Also, the contact 102 has a substantially L-shape, and its short side portion 102a is attached to the second contact end 103b opposite side of the first contact end 103a of the piezoelectric element 103. The contact 101 and the contact 102 are made of, for example, stainless steel.

The rotor 104 has a disk shape (or columnar shape) and can rotate around the axis L, the peripheral surface is sandwiched between the long side portion 101b of the contact 101 and the long side portion 102b of the contact 102. A pressure is applied between the rotor 104, the contactor 101, and the contact 102 so as to have a required static frictional force. The contact 104 is made of, for example, stainless steel.

In order to obtain a stable static frictional force, it is also possible to cut a male screw on the rotor 104 and cut a corresponding groove on the contact 101 and the contact 102.

As the piezoelectric element 103, a laminated type in which a plurality of plate-shaped piezoelectric bodies are laminated with an electrode interposed therebetween can be used. As the piezoelectric material constituting the piezoelectric body, a ceramic material having a piezoelectric effect is used, and for example, lead zirconate titanate (Pb(Zr, Ti)O$_3$;PZT) can be used. The shape of the piezoelectric element 103 can be various shapes such as a rectangular parallelepiped, a triangular prism, a hexagonal prism, and a cylinder.

The moment of inertia member 105 is provided so as to be coaxially fixed to the rotor 104, has a diameter larger than that of the rotor 104, and gives a moment of inertia to the rotor 104. The moment of inertia member 105 is made of, for example, brass, stainless steel, etc.

In the valve adjusting mechanism 10 configured as described above, the contact 101 and the contact 102 move relative to each other (hereinafter, also referred to as the drive of the contact 101 and the contact 102) by driving the piezoelectric element 103, as a result, the rotor 104 rotates forward or reversely, and moves (advances and retreats) in the z-axis direction corresponding to the rotation direction. This will be described in detail later.

(Control Device 20)

Figure 3C:
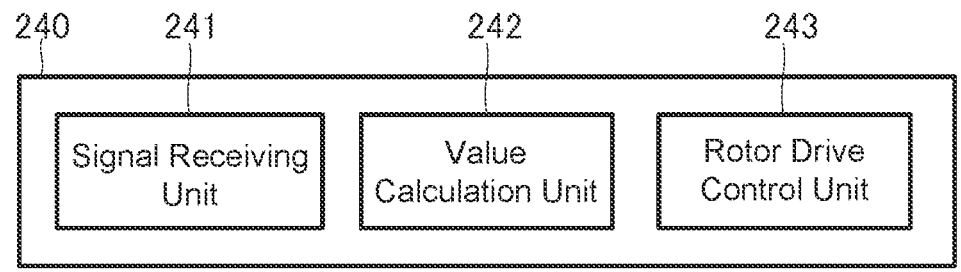
FIG. 3C is a functional block diagram showing the function of a control device.
Figure 4:
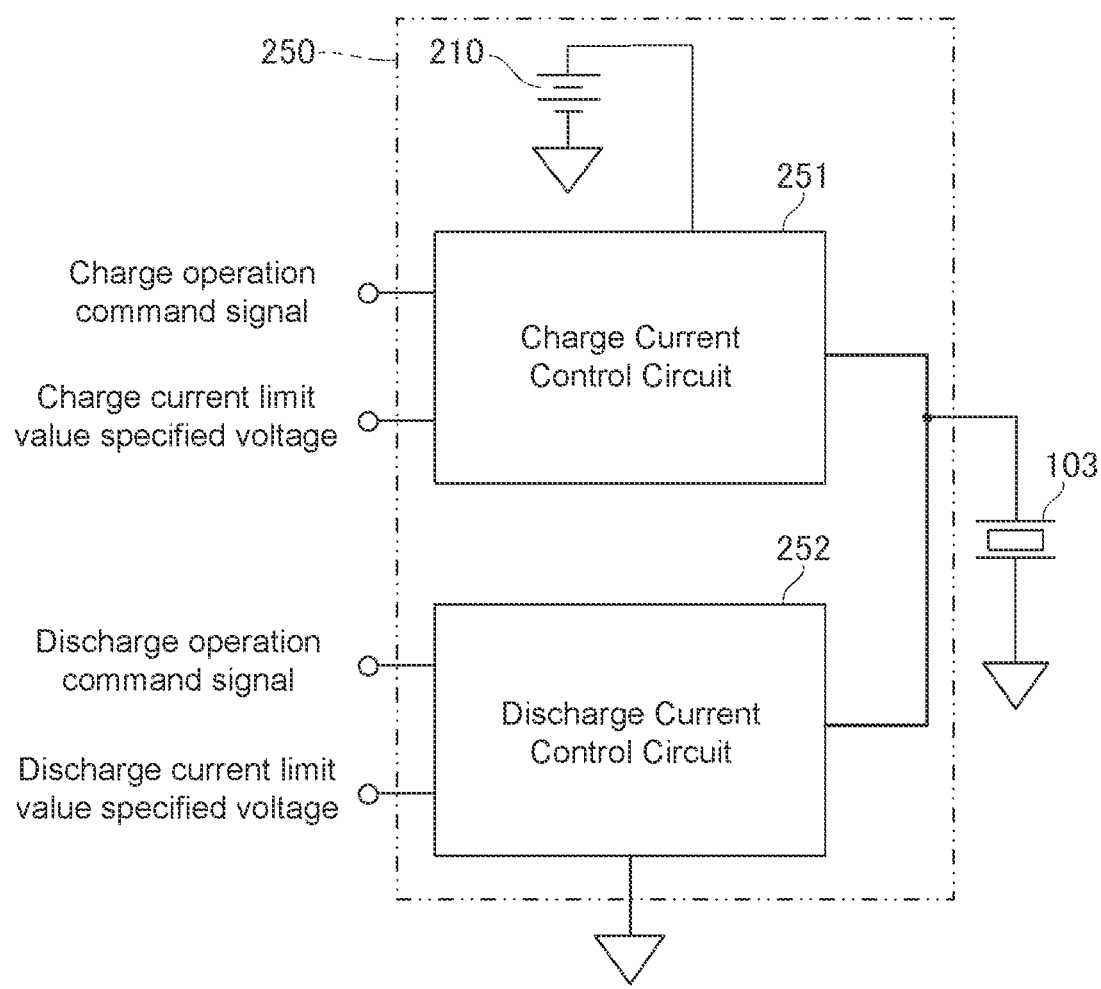
FIG. 4 is a block diagram which shows the structure of the rotor drive unit of the control unit.

Next, the control device 20 will be described with reference to FIGS. 3A to 4. FIG. 3A is a configuration diagram showing the configuration of the valve control device 20. FIG. 3B is a configuration diagram showing the configuration of the conversion table TB. FIG. 3C is a functional block diagram showing the functions of the control unit 240 of the control device 20. FIG. 4 is a configuration diagram showing the configuration of the rotor drive unit 250 of the control device 20.

As shown in FIG. 3A, the control device 20 includes a power supply unit 210, an I/O unit 220, a memory device 230, a control unit 240, and a rotor drive unit 250 (also referred to as a driver). The arrangement position of the control device 20 is not particularly limited, like the valve adjusting mechanism 10, it may be housed in the fluid adjusting device 30, it may be arranged at spatially separated positions without being accommodated in the fluid adjusting device 30.

Furthermore, it may be configured such that some configurations included in the control device 20 are housed in the fluid adjusting device 30, and that some other configurations are not housed in the fluid adjusting device 30 and are arranged at spatially separated positions. For example, it may be configured such that the I/O unit 220 and the rotor drive unit 250 are housed in the fluid adjusting device 30, and the power supply unit 210, the memory device 230, and the control unit 240 are not accommodated in the fluid adjusting device 30 and are not arranged at spatially separated positions.

As described above, the valve control device 1 having a configuration in which all or at least a part of the control device 20 is not accommodated in the fluid adjusting device 30 is also referred to as a valve control system 1. In the valve control system 1, for example, an electronic device such as a personal computer (PC) can be used as the control device 20.

Here, the control device 20 can also be configured to accept an input from an input device such as a keyboard (for example, an operation for instructing the opening/closing of the valve portion 310a (or the valve portion 310b)), which is not shown, the fluid adjusting device 30 may be controlled based on such an input. Furthermore, for example, the control device 20 may include a port for connecting a display device such as a liquid crystal display or an organic EL (electroluminescence) display.

The power supply unit 210 has at least a function as a DC power supply (DC power supply) and supplies electric power to each unit. The power supply unit 210 has various electric circuits and/or electronic circuits (not shown), and can control current and voltage. More specifically, the power supply unit 210 can include at least one function of, for example, a transformer, an oscillator, a switching regulator, an inverter, or a converter.

The I/O unit 220 is an interface for electrically connecting each unit of the control device 20 (for example, the rotor drive unit 250) and the piezoelectric element 103, the drive control of the piezoelectric element 103 (that is, the rotation control of the rotor 104) is performed via the I/O unit 220.

The I/O unit 220 can also have a function as an interface for the control device 20 to communicate with an external device. Communication can be either wired or wireless.

The I/O unit 220 enables various signals to be transmitted/received to/from an external device. This signal includes various information necessary for opening and closing the valve portion 310a (or valve portion 310b) of the fluid adjusting device 30, such as a signal instructing the opening/closing of the valve portion 310a (or the valve portion 310b), information indicating at least one of the flow rate, the flow velocity, and the pressure of the fluid flowing in the fluid adjusting device 30 and the like, can be included.

The memory device 230 is, for example, a ROM (read only memory) or a RAM (Random Access Memory). The memory device 230 stores, for example, a program for controlling the rotor drive unit 250, data (for example, the conversion table TB described later), and various set values (for example, information indicating various voltage and current values and supply timings to be supplied to the rotor drive unit 250, which will be described later).

The control unit 240 is, for example, a CPU (Central Processing Unit), an MPU (Micro-processing Unit), a system LSI, an IC chip group smaller than the system LSI, or the like. When the control unit 240 executes the program, various functions described in the present embodiment are realized.

As shown in FIG. 3B, the conversion table TB is stored in the memory device 230. When the control device 20 is configured to be able to communicate with a server, a personal computer, or the like via a network (not shown), it is not necessary to store the conversion table TB in the memory device 230. In this case, various numerical values stored in the conversion table TB are appropriately transmitted and received via the network.

At least the "number of drives", the "amount of rotation", and the "control target amount" are associated with the conversion table TB. The conversion table TB may include information indicating the driving direction (that is, the rotation direction of the rotor 104) corresponding to the "number of drives".

Various values are used for each value of the conversion table TB, but here, as an example, the "number of drives" is the number of relative movements (number of round trips) of the contacts 101 and 102.

Further, the "amount of rotation" is the displacement amount of the contact 101 and the rotor 104 rotated by the contact 102, which are relatively moved by the above-mentioned "number of drives". The amount of rotation may be, for example, the number of rotations (times), the angle of rotation (degrees), the angle of rotation (radian: rad), or the moving distance (such as [nm] described above) (in FIG. 3B, "rad" is used as one example). Or, the opening degree (%) of the valve portion 310a (or the valve portion 310b) may be used, or the contact force between the valve body 311b and the valve seat 312b may be used. The contact force can be expressed in various units such as [N] (Newton).

The opening degree is represented by, for example, 0% to 100% (a state in which the valve portion 310a (or the valve portion 310b) is completely closed to a state in which the valve portion 310a (or the valve portion 310b) is fully open). The opening degree may be calculated by the control device 20 from the number of drives and the drive direction.

The "control target amount" is a predetermined physical amount (physical value) of the control target controlled by opening and closing the valve portion 310a (or valve portion 310b). The control target amount is, for example, at least one of the flow rate of the fluid flowing through the fluid adjusting device 30 (volume flow rate [m^3/s] as an example of the unit), the flow velocity ([m/s] as an example of the unit), and the pressure ([Pa] as an example of the unit).

However, in addition to the above volume flow rate, for example, a mass flow rate [kg/s], a flow rate [slm (standard liter (liter)/min)], or a flow rate [ccm (cc/min)] may be used (in FIG. 3B, "m^3/s" is used as an example). Similarly, the flow velocity and pressure are appropriately set.

When, for example, at least one of the flow rate, the flow velocity, and the pressure of the fluid flowing through the fluid adjusting device 30 is desired to be set to a predetermined value by the conversion table TB, the control device 20 can acquire or calculate how much amount of rotation the rotor 104 should be rotated and how many times the rotor 104 is driven for that purpose.

Also, by the conversion table TB, for example, as a result of rotating the rotor 104 in a predetermined number of times and directions, the control device 20 can acquire or calculate the values of the flow rate, the flow velocity, and the pressure of the fluid flowing through the fluid adjusting device 30.

The conversion table TB may be a table in which the number of drives and the amount to be controlled correspond to each other.

As shown in FIG. 3C, the control unit 240 functions as at least a signal receiving unit 241 and a value calculation unit 242 and a rotor drive unit control unit 243.

The signal receiving unit 241 receives various signals via the I/O unit 220. For example, the signal receiving unit 241 receives a signal instructing the opening/closing of the valve unit 310a (or the valve unit 310b) described above and a target adjustment amount from the outside.

A value calculation unit 242 acquires or calculates various values necessary for controlling the valve unit 310a (or valve unit 310b) from the conversion table TB in correspondence with the various signals received by the signal receiving unit 241. More specifically, the value calculation unit 242 refers to the conversion table TB and acquires each value (for example, the value of the number of drives, the amount of rotation, and the amount to be controlled). Further, the value calculation unit 242 can also calculate the opening degree as needed as described above.

The value calculation unit 242 performs various calculations including integration of the number of drives corresponding to the number of drives of the contact 101 and the contact 102, for example, based on the state of 0% opening degree, and calculates the opening degree of the valve portion 310a (or valve portion 310b) after driving the contact 101 and the contact 102. At this time, the value calculation unit 242 appropriately increases or decreases the integrated value in consideration of the driving direction. As a result, a predetermined opening degree from 0 to 100% is calculated.

The value calculation unit 242 can also calculate the opening degree from the amount of rotation and the control target amount. Further, the value calculation unit 242 can the number of drives and the drive direction, for example, in order to change from a predetermined opening (assumed to be the first opening) to an opening different from this predetermined opening (temporarily set to the second opening).

The value calculation unit 242 can also calculate the values of the number of drives, the amount of rotation, and the amount of control target as necessary by referring to the conversion table TB, in the same manner as calculating the opening degree.

A rotor drive unit control unit 243 controls the rotor drive unit 250 shown in FIG. 3A in correspondence with the value acquired or calculated by the value calculation unit 242. More specifically, the rotor drive unit control unit 243, corresponding to the value acquired or calculated by the value calculation unit 242, inputs a charge operation command signal, a charge current limit value specified voltage (also referred to as a charge current limit value command voltage or a charge current maximum value specified voltage), a discharge operation command signal, and a discharge current limit value specified voltage (also referred to as a discharge current limit value command voltage or a discharge current maximum value specified voltage), which will be described later with reference to FIG. 4 to the rotor drive unit 250. These signals and voltages enable the rotor drive unit 250 to control the drive of the piezoelectric element 103, as a result, the rotor 104 rotates and moves in the z-axis direction, and the valve portion 310a (or valve portion 310b) is opened and closed.

In short, when the control unit 240 refers to the conversion table TB, the piezoelectric element 103 is controlled, and the rotor 104 rotates and moves in the z-axis direction shown in FIG. 1. As a result, the valve portion 310a (or valve portion 310b) is opened and closed.

As shown in FIG. 4, the rotor drive unit 250 includes a charge current limiting circuit 251 and a discharge current limiting circuit 252.

A charge current limiting circuit 251 and the discharge current limiting circuit 252 constitute a switching circuit. The charge current limiting circuit 251 connects the power supply unit 210 and the piezoelectric element 103 to charge the piezoelectric element 103 with a current, and the discharge current limiting circuit 252 discharges the current from the piezoelectric element 103.

The charge current limiting circuit 251 connects between the power supply unit 210 and the piezoelectric element 103 to charge the piezoelectric element 103 with a current, while the charge operation command signal (signal commanding the current charge operation) input from the rotor drive unit control unit 243 of the control unit 240 (see FIG. 3C) is ON.

The charge current value flowing into the piezoelectric element 103 at that time is limited according to the charge current limit value designated voltage input from the rotor drive unit control unit 243 of the control unit 240.

That is, the charge current limit value designation voltage specifies the limit value (maximum value) of the current flowing into the piezoelectric element 103 when the power supply unit 210 and the piezoelectric element 103 are connected, which is set in proportion to the maximum value of the inflowing current.

The discharge current limiting circuit 252 is a discharge operation command signal (a signal for commanding a current discharge operation from the piezoelectric element 103) input from the rotor drive unit control unit 243 of the control unit 240, while the discharge operation command signal is ON, connects between the piezoelectric element 103, which is a load, and the ground, and discharges the current of the piezoelectric element 103.

At that time, the current value flowing out from the piezoelectric element 103 is limited according to the discharge current limit value specified voltage.

That is, the discharge current limit value specified voltage specifies the limit value (maximum value) of the current flowing out from the piezoelectric element 103 when the piezoelectric element 103 and the ground are connected, which is specified in proportion to the maximum value of the outflow current.

(Explanation of Operation)

Hereinafter, the drive control of the piezoelectric element 103 by the charge current limiting circuit 251 and the discharge current limiting circuit 252 when rotating the rotor 104 will be described with reference to FIGS. 5A to 5C.

Figure 5A:
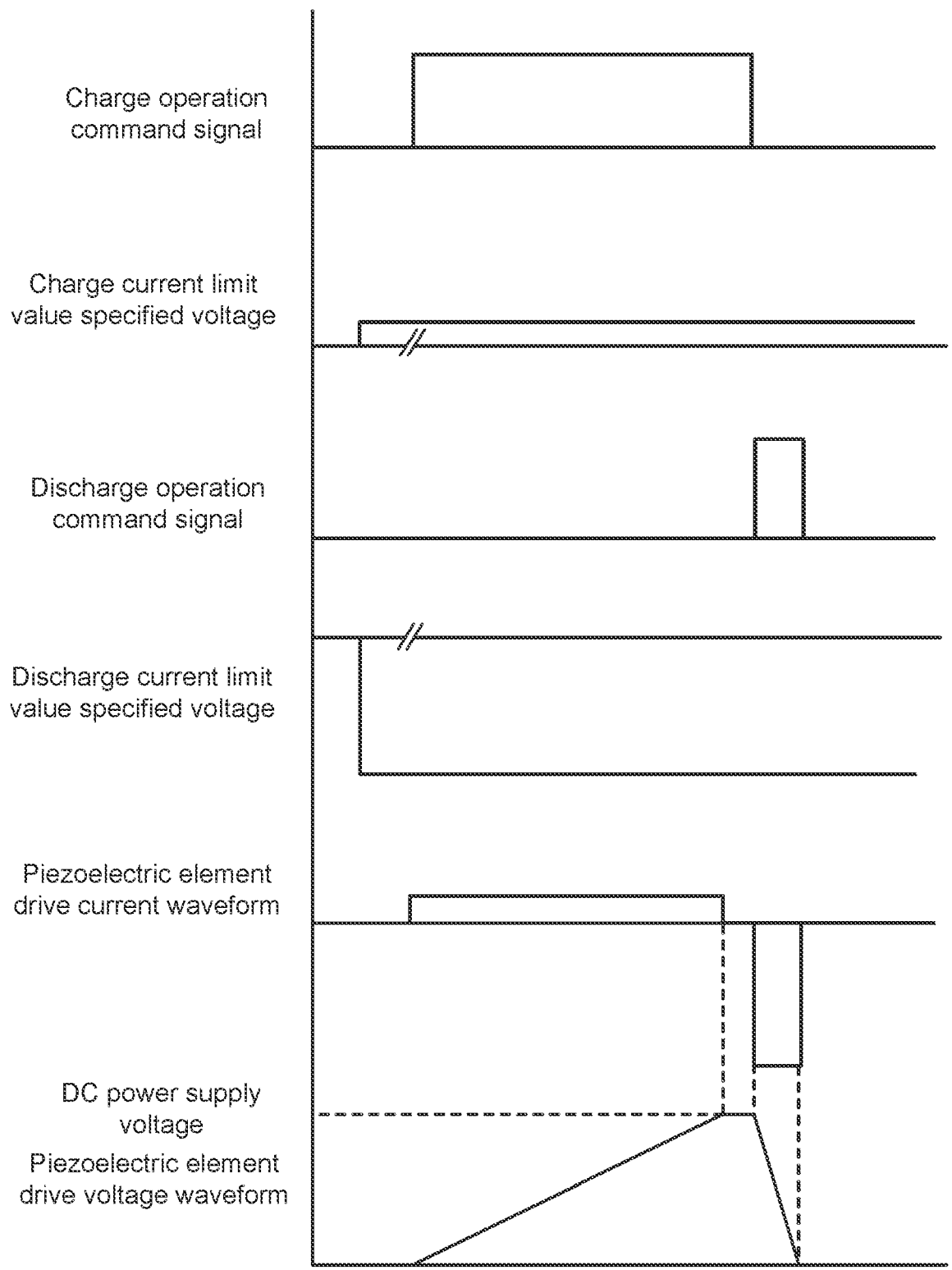
FIG. 5A is a diagram showing the configuration of the control unit.

FIG. 5A is a clockwise rotation of the rotor (as described above, clockwise when the valve adjusting mechanism 10 is viewed from above in a plan view, as shown in FIG. 2), and is a figure for demonstrating the control at the time of rotating the valve part 310a (or the valve part 310b) in the closing direction). FIG. 5B is a schematic view for explaining the state of the rotor rotating clockwise in the forward direction. FIG. 5C is a counterclockwise rotation of the rotor counterclockwise (counterclockwise when the valve adjusting mechanism 10 is viewed from above in a plan view as shown in FIG. 2), and is a figure for demonstrating control at the time of rotating the valve part 310a (or the valve part 310b) in the opening direction).

First, a case where the rotor 104 is rotated in the forward direction will be described with reference to FIGS. 5A and 5B.

As shown in FIG. 5A, in the charge current limiting circuit 251 and the discharge current limiting circuit 252, the charge current limit value designated voltage and the discharge current limit value designated voltage are applied in advance before the time when the charge operation command signal and the discharge operation command signal are turned on.

The charge current limit value specified voltage value is set to a relatively low value, and the discharge current limit value command voltage is set to a relatively high value.

When the charge operation command signal is turned on, the power supply unit 210 and the piezoelectric element 103, which is a load, are connected to each other, but, since charge current limit value specified voltage value is relatively low, the current value flowing into the piezoelectric element 103 (piezoelectric element drive current waveform) is low, and the voltage across the piezoelectric element 103 (piezoelectric element drive voltage waveform) rises with a relatively gentle slope.

That is, since the piezoelectric element 103 has electrical properties similar to those of a capacitor, as described below, when the current value is low, the voltage gradient becomes gentle, as described below.

When a current is supplied to a capacitor from a constant current source, the voltage across the capacitor becomes a voltage proportional to time. Assuming that the capacitance of the capacitor is C and the supply current from the current source is I, the voltage across the capacitor V and the time gradient of the voltage are as shown in equations (1) and (2), respectively.

$$V = I/C \cdot t \quad (1)$$

$$dV/dt = I/C \quad (2)$$

When the current value I is low, dV/dt is low and the voltage gradient becomes gentle as shown in Eq. (2).

Then, when the voltage reaches the DC power supply voltage of the power supply unit 210, the flowing current is automatically stopped. Since the piezoelectric element 103 has the function of a capacitor, the voltage across it is maintained even after the inflowing current is stopped. At this time, the charge operation command signal is turned off.

Subsequently, when the discharge operation command signal is turned on, the ground and the piezoelectric element 103 are connected, but, since discharge current limit value High specified voltage value, the current value (piezoelectric element drive current waveform) flowing into the piezoelectric element 103 is high, contrary to the charging time described above, the voltage across the piezoelectric element 103 drops with a steep slope. Then, when the voltage reaches the ground potential, the flowing current automatically stops. At this time, the voltage across the piezoelectric element is maintained at zero. At this time, the discharge operation command signal is turned off.

In this way, a substantially serrated voltage (piezoelectric element drive voltage waveform) is applied to both ends of the piezoelectric element 103 by charging or discharging the current by the charge current limiting circuit 251 and the discharge current limiting circuit 252, the piezoelectric element 103 can expand and contract to cause relative movement between the contact 101 and the contact 102.

At this time, when the force generated by the acceleration of rotational motion generated in the moment of inertia member 105 due to the acceleration of the relative movement of the contact 101 and the contact 102 is less than or equal to the static friction force between the rotor 104 and the contact 101, and between the rotor 104 and the contact 102, the rotor 104 rotationally moves due to the relative movement of the contact 101 and the contact 102, and when said force is larger than static friction, a slip occurs between the rotor 104 and the contacts 101 and 102.

More specifically, by applying a gradual voltage change to the piezoelectric element 103, the contact 102 moves gently, and the rotor 104 can be rotated by the static friction force, and further, by applying a steep voltage change, the contact 102 moves rapidly to overcome the frictional force, and the moment of inertia member 105 acts to generate a slip between the rotor 104 and the contact 101 and the contact 102, and only the contact 101 and the contact 102 can be moved. Therefore, the rotational motion of the rotor 104 can be continued for a predetermined period by giving a voltage waveform similar to a so-called sawtooth wave in which the rising slope and the falling slope are different.

Figure 5B:
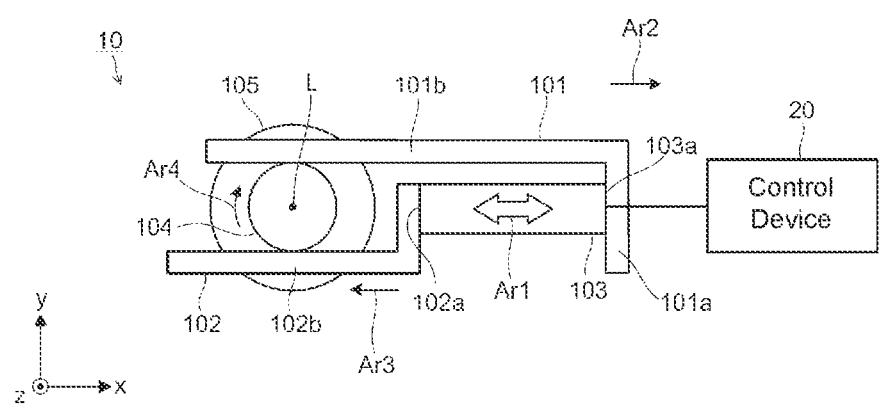
FIG. 5B is a figure for demonstrating the control when the rotor is rotated clock wisely.

That is, in the case of the control as shown in FIG. 5A, due to the extension of the piezoelectric element 103 due to the gradual voltage rise caused by the charge current (see arrow Ar1 in FIG. 5B), the entire contact 101 retracts in the direction in which the tip end side of the long side portion 101b opposite to the short side portion 101a approaches the rotor 104 (see arrow Ar2 in FIG. 5B), the entire contact 102 advances in the direction in which the tip end side of the long side portion 102b opposite to the short side portion 102a is separated from the rotor 104 (see arrow Ar3 in FIG. 5B), whereby the rotor 104 rotates in the clockwise direction (see arrow Ar4 in FIG. 5B). Then, due to the degeneracy (returning) of the piezoelectric element 103 due to the steep voltage drop caused by the discharge current, a slip occurs between the contact 101 and the contact 102, and the positions of the contact 101 and the contact 102 return to their original positions while the rotor 104 is in a rotated state. By repeating this, the rotary motion of the rotor 104 in the clockwise direction continues. The rotated rotor 104 moves in the z-axis direction so as to close the valve portion 310a (or the valve portion 310b).

Next, a case where the rotor 104 is rotated counterclockwise with reference to FIG. 5C will be described. Even when the rotor 104 is rotated counterclockwise, in the charge current limiting circuit 251 and the discharge current limiting circuit 252, the charge current limit value designated voltage and the discharge current limit value designated voltage are applied in advance before the time when the charge operation command signal and the discharge operation command signal are turned on.

The charge current limit value specified voltage is set to a relatively high value, and the discharge current limit value command voltage is specified to a relatively low value.

When the charge operation command signal is turned on, the power supply unit 210 and the piezoelectric element 103 are connected, but since the maximum charge current value specified voltage value is high, the current value (piezoelectric element drive current waveform) flowing into the piezoelectric element 103 is high, the voltage across the piezoelectric element 103 rises with a steep slope, and when the DC power supply voltage is reached, the flowing current automatically stops.

Then, the voltage across the piezoelectric element 103 rises with a steep slope, and when the DC power supply voltage is reached, the flowing current automatically stops, but since discharge current limit value specified voltage value is relatively low, the voltage across the piezoelectric element drops with a gentle slope, and when the ground potential is reached, the flowing current automatically stops.

Figure 5C:
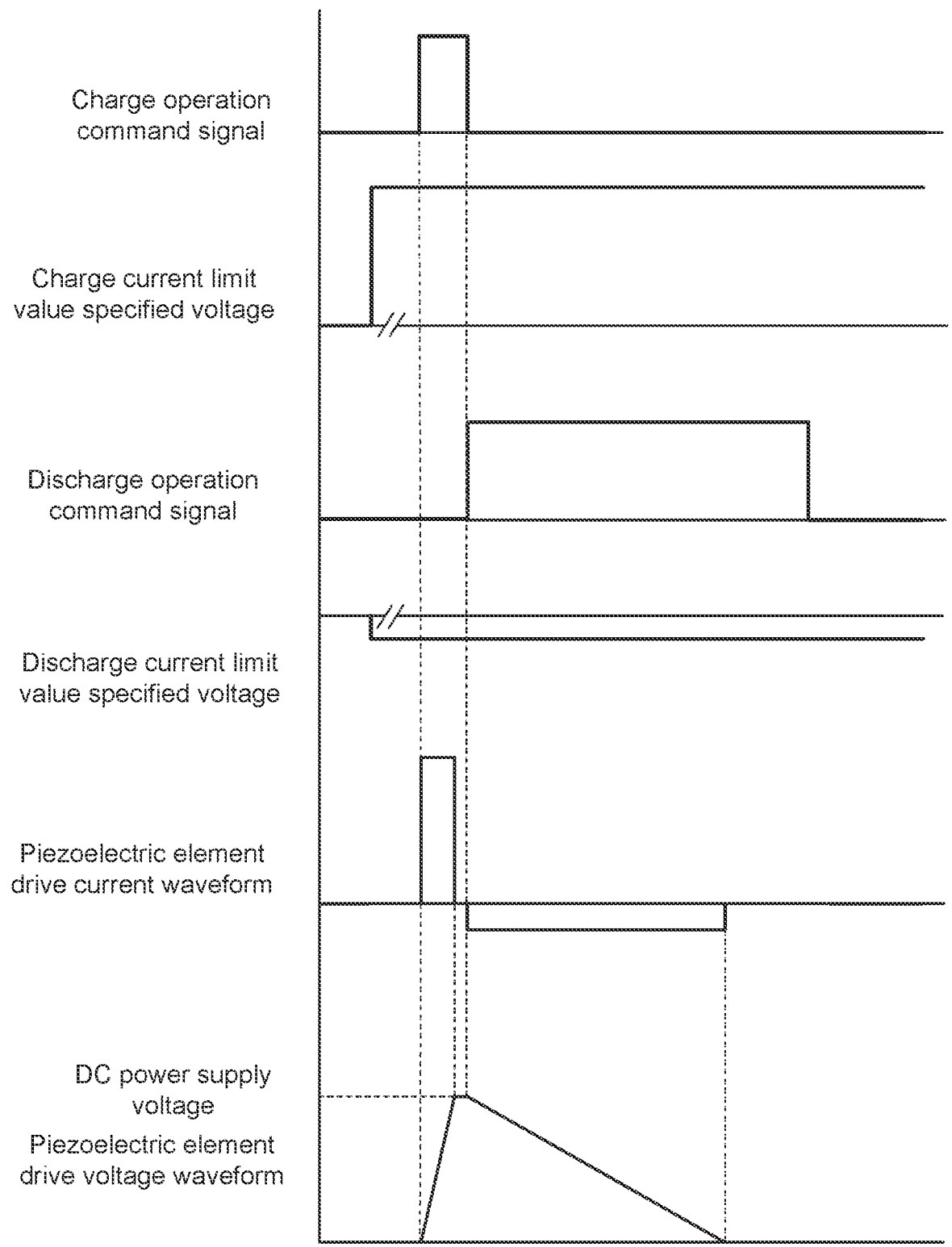
FIG. 5C is a schematic diagram which shows the state of the rotor which rotates clock wisely.

By the piezoelectric element drive waveform as shown in FIG. 5C, it is configured such that the force generated by the acceleration generated on the moment of inertia member 105 by the charge current exceeds the static friction force between the rotor 104 and the contact 101 and between the rotor 104 and the contact 102, while the force generated by the acceleration generated on the moment of inertia member 105 by the discharge current does not exceed the static friction force between the rotor 104 and the contact 101, and between the rotor 104 and the contact 102.

That is, in the case of FIG. 5C, the expansion of the piezoelectric element 103 due to the steep voltage rise caused by the charge current causes slippage between the rotor 104 and the contact 101 and the contact 102. Then, due to the degeneracy (returning) of the piezoelectric element 103 due to the gradual voltage drop caused by the discharge current, the contact 101 and the contact 102 move so as to return to their original positions, and the rotor 104 rotates counterclockwise (that is, the rotor 104 rotates in the direction opposite to the state shown in FIG. 5B). By repeating this, the rotary motion of the rotor 104 in the counterclockwise direction continues. The rotated rotor 104 moves in the z-axis direction so as to open the valve portion 310a (or the valve portion 310b).

As mentioned above, due to the charge current or discharge current of the piezoelectric element 103 by the charge current limiting circuit 251 and the discharge current limiting circuit 252, the piezoelectric element drive voltage waveform of the piezoelectric element 103 has a sawtooth shape having different slopes at the rising and falling edges, but as long as the rising slope and the falling slope angle are different, the piezoelectric element drive voltage waveform may have a wave shape similar to a so-called triangular wave or a trapezoidal wave shape.

Furthermore, the rotor drive unit control unit 243 can control the rotor drive unit 250 so that the rotor 104 does not rotate in a direction in which an excessive force is applied to the valve portion 310a (or valve portion 310b).

"The direction in which an unreasonable force is applied to the valve portion 310a (or valve portion 310b)" is, for example, the direction in which the opening degree exceeds 0% and the valve portion 310a (or the valve portion 310b) is further closed. Similarly, the opening degree exceeds 100% and the valve portion 310a (or the valve portion 310b) is further opened.

As explained above, the valve control device 1 according to the first embodiment comprises: a rod-shaped rotor (the rotor 104) provided so as to rotate about a rotation axis (the axis L), wherein one end of the rotor is directly or indirectly connected to a valve body (the valve body 311a or the valve body 311b), at least a part of the valve body being positioned in a flow path for fluid, wherein rotation of the rotor changes a relative position between the valve body and a valve seat (the valve seat 312a or the valve seat 312b) that is closed by the valve body or a contact force between the valve body and the valve seat; a pair of contacts (the contact 101 and the contact 102) for sandwiching the rotor, wherein relative movement of the pair of contacts rotates the rotor; a moving unit comprising a piezoelectric element (the piezoelectric element 103) for causing the pair of contacts to perform relative movement; and a drive control unit (the rotor drive unit 250) for controlling the relative position between the valve body and the valve seat by applying a voltage waveform having a rising slope and a falling slope different from the rising slope to the piezoelectric element so as to cause the rotor to rotate in a desired direction, wherein a gentler slope of the rising slope and the falling slope causes the pair of contacts to rotate the rotor, and a steeper slope of the rising slope and the falling slope causes a slip between the rotor and the pair of contacts.

In the valve control device 1, since the rotor 104 is fixed in position when the piezoelectric element 103 is not driven, it is not necessary to provide a locking mechanism (for example, a fixing nut) such that the position of the valve body 311*a* (or the valve body 311*b*) is fixed at the end of the adjustment work of the valve body 311*a* (or the valve body 311*b*). As a result, for example, it is possible to prevent the adjustment from being misaligned due to the backlash of the fixing nut after the adjustment of the needle valve in the axial direction.

If equipped with a fixing nut, for example, in a factory where a large machine is operating, the fixing nut may loosen due to vibration and the adjustment position may shift, but the valve control device 1 does not have to be provided with a fixing nut, and is therefore suitable for use in such a place.

Moreover, since the rotor 104 rotates in small units such as nanometer (nm), micrometer (μm), and millimeter (mm), it is possible to perform more precise adjustment than manual adjustment by an operator. In addition, the reproducibility of the adjustment is extremely higher than that of the manual adjustment by the operator, and the adjustment error of each adjustment can be reduced when the adjustment is performed a plurality of times. That is, stable adjustment is possible.

The drive control unit (rotor drive unit 250) of the valve control device 1 according to the first embodiment causes the rotor (the rotor 104) to rotate in accordance with a value obtained from a table (the conversion table TB) in which a value of an amount of rotation of the rotor from a first position to a second position, a value of a number of times (a number of times of driving) that the pair of contacts is driven to achieve the amount of rotation, and a physical value (controlled amounts) relevant to the fluid are associated with each other.

For example, a configuration in which the rotation position of the rotor 104 is detected by using a DC motor or an encoder can be considered, but when these are used, the structure may be complicated or the device may become huge.

In the valve control device 1, the piezoelectric element 103 is driven to rotate the rotor 104 according to the value obtained from the conversion table TB, so that the structure can be easily simplified. Moreover, a configuration in which the rotor 104 is rotated by using a stepping motor instead of the DC motor or the encoder is conceivable, but even when the stepping motor is used, the device may become huge. In comparison, the rotation mechanism of the rotor 104 using the piezoelectric element 103 is suitable for miniaturization of the device.

The valve control device 1 according to the first embodiment comprises a DC power supply (the power supply unit 210) for supplying electric power to the piezoelectric element (the piezoelectric element 103), wherein the drive control unit (the rotor drive unit 250) controls a flow of current between the DC power supply and the piezoelectric element so as to change the voltage waveform of a voltage applied between terminals of the piezoelectric element to a sawtooth shape or a trapezoidal shape.

In the valve control device 1, the rotor 104 can be suitably driven by a sawtooth-shaped or trapezoidal voltage waveform.

The valve control device 1 according to the first embodiment comprises a main body (the main body 300*a*) having a first connecting portion (the first port 301*a*) and a second connecting portion (the second port 302*a*) that communicate with a fluid passage (the flow path), and having a passage (the passage 303*a*) through which the first connecting portion communicates with the second connecting portion, wherein: one end of the rotor (the rotor 104) is directly or indirectly connected to the valve body (the valve body 311*a*) in the main body; and a change in the relative position of the valve body and the valve seat (the valve seat 312*a*) or the contact force between the valve body and the valve seat adjusts at least one of a flow rate, a flow velocity, and a pressure of fluid flowing through the passage.

The valve control device 1 can suitably adjust at least one of the flow rates, the flow velocity, and the pressure of the fluid.

The valve control device 1 according to the first embodiment is characterized in that the valve body (the valve body 311*a*) and the valve seat (the valve seat 312*a*) are a needle valve mechanism that is arranged inside the main body (the main body 300*a*) and is capable of being opened or closed.

The valve control device 1 is suitable for opening/closing control of the needle valve.

The valve control device 1 according to the first embodiment, characterized in that: the passage (the passage 303*a*) is divided into a first passage (the first passage 304*a*) and a second passage (the second passage 305*a*) by the valve seat (the valve seat 312*a*); the valve seat comprises a hole (the hole 313*a*) for allowing fluid to flow from the first passage to the second passage; the valve body (the valve body 311*a*) comprises a first end that is directly or indirectly connected to the one end of the rotor (the rotor 104), and a second end that is opposite to the first end and is capable of closing the hole; the drive control unit (the rotor drive unit 250) causes the rotor to rotate in a direction such that the valve body moves in a direction to close or open the hole, which movement changes the relative position between the valve body and the valve seat or the contact force between the valve body and the valve seat so that at least one of the fluid pressure, the flow rate, and the flow velocity is adjusted.

In the valve control device 1, the rotor drive unit 250 rotates the rotor 104 in an arbitrary direction, thereby easily making variable the relative position between the valve body 311*a* and the valve seat 312*a* or the contact force between the valve body 311*a* and the valve seat 312*a*. As a result, at least one of the fluid pressures, flow rate and flow velocity in the apparatus configured as described above can be suitably adjusted.

The valve control device 1 according to the first embodiment, characterized in that: the passage (the passage 303*b*) is divided into a first passage (the first passage 304*b*) and a second passage (the second passage 305*b*) by the valve seat (the valve seat 312*b*); the valve seat comprises a hole (the hole 313*b*) for allowing fluid to flow from the first passage to the second passage; the valve body (the valve body 311*b*) comprises a connecting portion (the top 371) connected to the one end of the rotor (the rotor 104) via an elastic body (the adjustment the spring 320 and/or the diaphragm 330), and a closing portion (the inclined surface 372) capable of closing the hole; the drive control unit (the rotor drive unit 250) causes the rotor (the rotor 104) to rotate in a direction such that the valve body moves in a direction to close or open the hole, which movement changes the contact force between the valve body and the valve seat so that the fluid pressure is adjusted.

In the valve control device 1, the rotor drive unit 250 rotates the rotor 104 in an arbitrary direction so that the rotor drive unit 250 rotates the rotor 104 in an arbitrary direction, and then the valve body 311*b* can move in the direction of closing or releasing the hole 313*b* to easily change the contact force between the valve body 311*b* and the valve seat 312*b*. As a result, it is suitable for adjusting the pressure of the fluid in the apparatus configured as described above.

The valve control device 1 according to the first embodiment is characterized in that the drive control unit (the rotor drive unit 250) comprises: a charge current limiting circuit (the charge current limiting circuit 251) connected to the DC power supply (the power supply unit 210), for charging the piezoelectric element (the piezoelectric element 103) with a current, and for limiting the charge current; and a discharge current limiting circuit (the discharge current limiting circuit 252) for discharging a current from the piezoelectric element and for limiting the discharge current, wherein: the charge current limiting circuit receives, as control inputs, input of a charge operation command signal for demanding a current charge from the DC power supply to the piezoelectric element, and of a charge current limit value command voltage (the charge current limit value specified voltage) indicative of a limit value of current flowing into the piezoelectric element; and the discharge current limiting circuit receives input, as control inputs, of a discharge operation command signal for demanding a current discharge from the piezoelectric element, and of a discharge current limit value command voltage (discharge current limit value specified voltage) indicative of a limit value of current flowing out from the piezoelectric element.

Moreover, the valve control device 1 according to the first embodiment is characterized in that the charge operation command signal (the charge current limit value specified voltage) is stopped in response to occurrence of an event that a value of a voltage applied to the piezoelectric element (the piezoelectric element 103) reaches a desired voltage that is below a voltage of the DC power supply (the power supply unit 210).

In the valve control device 1, the rotor drive unit 250 is provided with the above configuration, so that a substantially serrated or trapezoidal voltage (the piezoelectric element drive voltage waveform) can be applied to both ends of the piezoelectric element 103. As a result, the piezoelectric element 103 can be expanded and contracted to cause relative movement between the contact 101 and the contact 102, and the rotor 104 can be rotated.

The valve control device 1 according to the first embodiment further comprises an inertial moment member (the moment of inertia member 105) fixed coaxially with the rotor (the rotor 104), for applying a moment of inertia to the rotor.

The moment of inertia member 105 can give a moment of inertia to the rotor 104, and is suitable, by driving the piezoelectric element 103 given a steep voltage change, to cause slip between the rotor 104 and the contact 101 and the contact 102.

The valve control device 1 according to the first embodiment is characterized in that the rotor is caused to rotate in response to occurrence of an event that an acceleration of relative movement of the pair of contacts (the contact 101 and the contact 102) generates an acceleration of rotational motion in the inertial moment member (the moment of inertia member 105), and a force generated by the acceleration of the rotational motion is smaller than or equal to a static friction force generated between the rotor and the pair of contacts; and a slip is caused between the rotor and the pair of contacts in response to occurrence of an event that an acceleration of relative movement of the pair of contacts generates an acceleration of rotational motion in the inertial moment member, and a force generated by the acceleration of the rotational motion is larger than a static friction force generated between the rotor and the pair of contacts.

In the valve control device 1, rotating the rotor 104 and causing a slip between the rotor 104 and the contact 101 and the contact 102 are alternately repeated, so that the rotor 104 can be continuously rotated in one direction (for example, the direction of forward rotation) or the opposite direction (for example, the direction of reverse rotation).

According to the first embodiment, the drive control device 20 is used in the valve control device that comprises: a rod-shaped rotor (the rotor 104) provided so as to rotate about a rotation axis (the axis L), wherein one end of the rotor is directly or indirectly connected to a valve body (the valve body 311*a* or the valve body 311*b*), at least a part of the valve body being positioned in a flow path for fluid, wherein rotation of the rotor changes a relative position between the valve body and a valve seat (the valve seat 312*a* or the valve seat 312*b*) that is closed by the valve body or a contact force between the valve body and the valve seat; and a pair of contacts (the contact 101 and the contact 102) for sandwiching the rotor at a predetermined pressure, wherein relative movement of the pair of contacts rotates the rotor, wherein the valve control device applies a voltage waveform having a rising slope and a falling slope different from the rising slope to the piezoelectric element (the piezoelectric element 103), wherein a gentler slope of the rising slope and the falling slope causes the pair of contacts to rotate the rotor, and a steeper slope of the rising slope and the falling slope causes a slip between the rotor and the pair of contacts. The drive control device comprises: a DC power supply (the power supply unit 210); and a switching circuit (the charge current limiting circuit 251 and the discharge current limiting circuit 252) for charging the piezoelectric element with a current and discharging a current from the piezoelectric element, and for limiting the charge current and the discharge current, wherein the switching circuit applies the voltage waveform to the piezoelectric element by differentiating a value of the charge current and a value of the discharge current from each other.

In the control device 20, by providing the above configuration, a substantially serrated or trapezoidal voltage (the piezoelectric element drive voltage waveform) can be applied to both ends of the piezoelectric element 103. As a result, the piezoelectric element 103 can be expanded and contracted to cause relative movement between the contact 101 and the contact 102, and the rotor 104 can be rotated.

The control device 20 according to the first embodiment is characterized in that the switching circuit (the charge current limiting circuit 251 and the discharge current limiting circuit 252) comprises: a charge current limiting circuit (the charge current limiting circuit 251) connected to the DC power supply (the power supply unit 210), for charging the piezoelectric element (the piezoelectric element 103) with a current, and for limiting the charge current; and a discharge current limiting circuit (the discharge current limiting circuit 252) for discharging a current from the piezoelectric element and for limiting the discharge current, wherein: the charge current limiting circuit receives, as control inputs, input of a charge operation command signal for demanding a current charge from the DC power supply to the piezoelectric element, and of a charge current limit value command voltage (the charge current limit value specified voltage) indicative of a limit value of current flowing into the piezoelectric element; and the discharge current limiting circuit receives input, as control inputs, of a discharge operation command signal for demanding a current discharge from the piezoelectric element, and of a discharge current limit value command voltage (the discharge current limit value specified voltage) indicative of a limit value of current flowing out from the piezoelectric element.

Moreover, the control device 20 according to the first embodiment is characterized in that the charge operation command signal is stopped in response to occurrence of an event that a value of a voltage applied to the piezoelectric element (the piezoelectric element 103) reaches a desired voltage that is below a voltage of the DC power supply (the power supply unit 210).

In the control device 20, by providing the above configuration, a substantially serrated or trapezoidal voltage (the piezoelectric element drive voltage waveform) can be applied to both ends of the piezoelectric element 103. As a result, the piezoelectric element 103 can be expanded and contracted to cause relative movement between the contact 101 and the contact 102, and the rotor 104 can be rotated.

The drive control unit (rotor drive unit 104) of the control device 20 according to the first embodiment is characterized in that the rotor (the rotor 104) is caused to rotate in accordance with a value obtained from a table (the conversion table TB) in which a value of an amount of rotation of the rotor from a first position to a second position, a value of a number of times (a number of times of driving) that the pair of contacts is driven to achieve the amount of rotation, and a physical value (controlled amount) relevant to the fluid are associated with each other.

In the control device 20, by referring to the value of the controlled quantity from the conversion table TB, information on how much the rotor 104 should be rotated (or how many times the contact 101 and the contact 102 should be driven) can be easily obtained. That is, the rotation control of the rotor 104 up to the control target amount to be adjusted becomes easy by referring to the conversion table TB.

Second Embodiment

Figure 6:
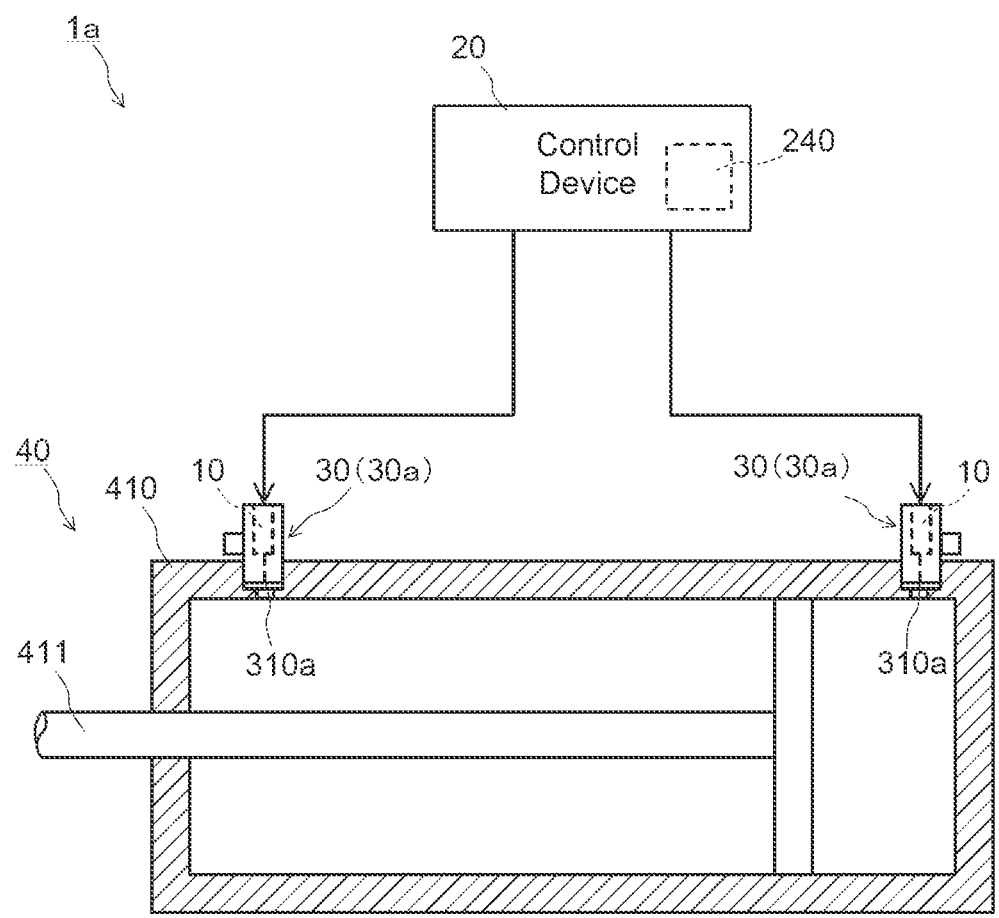
FIG. 6 is a partial cross-sectional view showing the fluid control device 1a according to the second embodiment.

Next, the fluid control device 1a, which is the second embodiment of the valve control device 1, will be described with reference to FIG. 6. FIG. 6 is a partial cross-sectional view for explaining the second embodiment of the valve control device 1. In the following description, the same reference numerals will be given to the configurations corresponding to the first embodiment, and detailed description thereof will be omitted.

As shown in FIG. 6, the fluid control device 1a is an embodiment in which the valve control device 1 is applied to the control of the air cylinder 40. The air cylinder 40 is configured so that the piston rod 411 inside the cylinder body 410 reciprocates by the force of air.

A plurality of fluid adjusting devices 30 (for example, a pair of speed controllers 30a) accommodating the valve adjusting mechanism 10 are attached to the air cylinder 40.

In such a configuration, the movement speed of the piston rod 411 can be appropriately changed by controlling the flow rate of air according to the opening degree of the valve portion 310a of the speed controller 30a, and the opening degree of one valve portion 310a of the pair of speed controllers 30a is made different from the opening degree of the valve portion 310a of the other speed controller 30a, so that, for example, various controls such as making the movement speed of the piston rod 411 different between the outward path and the return path are possible.

The control unit 240 of the control device 20 can independently control the pair of speed controllers 30a based on the conversion table TB. The application example of the valve control device 1 is not limited to the air cylinder, and can be applied to a configuration in which the cylinder is moved by a liquid.

In the fluid control device 1a according to the second embodiment, the control unit 240 controls the pair of speed controllers 30a, while the control unit 240 may control more speed controllers 30a independently. Alternatively, at least one speed controller 30a and at least one regulator 30b may be mixed so that the control unit 240 controls each independently.

The fluid control device 1a according to the second embodiment comprises: a plurality of piezoelectric inertial rotation mechanisms (the valve adjusting mechanism 10), each of which comprises: a rod-shaped rotor (the rotor 104) provided so as to rotate about a rotation axis (the axis L), wherein one end of the rotor is directly or indirectly connected to a valve body (the valve body 311a or the valve body 311b), at least a part of the valve body being positioned in a flow path for fluid, wherein rotation of the rotor changes a relative position between the valve body and a valve seat (the valve seat 312a or valve seat 312b) that is closed by the valve body or a contact force between the valve body and the valve seat; a pair of contacts (the contacts 101 and the contacts 102) for sandwiching the rotor, wherein relative movement of the pair of contacts rotates the rotor; and a moving unit comprising a piezoelectric element (the piezoelectric element 103) for causing the pair of contacts to perform relative movement; a drive control unit (control device 20) for controlling, for each of the plurality of piezoelectric inertial rotation mechanisms, the relative position between the valve body and the valve seat by applying a voltage waveform having a rising slope and a falling slope different from the rising slope to the piezoelectric element so as to cause the rotor to rotate in a desired direction, wherein a gentler slope of the rising slope and the falling slope causes the pair of contacts to rotate the rotor, and a steeper slope of the rising slope and the falling slope causes a slip between the rotor and the pair of contacts; and an air cylinder (air cylinder 40) comprising a main body (the cylinder main body 410) to which the plurality of piezoelectric inertial rotation mechanisms are attached, and a piston portion (the piston rod 411) arranged in the main body, wherein movement of the piston portion is controlled by changing the relative position between the valve body and the valve seat or the contact force between the valve body and the valve seat.

In the fluid control device 1a, the control device 20 can control the movement of the air cylinder 40 by controlling the plurality of valve adjusting mechanisms 10. In the fluid control device 1a, the same effect as that of the valve control device 1 can be obtained, and the air cylinder 40 can be suitably controlled.

OTHER EMBODIMENTS

The present invention is not limited to the first and second embodiments described above, and various modifications and variably changes can be made. For example, each time the opening degree of the valve portion 310a (or the valve portion 310b) is controlled, a counter may be provided to count and display the opening degree. In the valve control device 1, since the control unit 240 mechanically controls the valve adjusting mechanism 10 to control the opening degree of the valve portion 310*a* (or the valve portion 310*b*), the opening degree can be easily counted.

Alternatively, the valve control device 1 may be provided with an external sensor (for example, a pressure sensor, a flow meter, etc.). If a pressure sensor is provided, for example, the contact force between the valve body 311*b* and the valve seat 312*b* can be measured and controlled in real time. Similarly, if a flow meter is provided, for example, the opening/closing positions of the valve body 311*a* and the valve seat 312*a* can be measured and controlled in real time.

INDUSTRIAL APPLICABILITY

As described above, the present invention can provide a valve control device suitable for valve adjustment.

EXPLANATION OF NUMERICAL SYMBOLS

1: Valve controller
1*a*: Fluid control device
10: Valve adjusting mechanism
20: Control device
30: Fluid adjusting device
30*a*: Speed controller
30*b*: Regulator
40: Air cylinder
101: Contact
102: Contact
103: Piezoelectric element
104: Rotor
105: Moment of inertia member
210: Power supply unit
220: I/O section
230: Memory device
240: Control unit
241: Signal receiving unit
242: Value calculation unit
243: Rotor drive unit control unit
250: Rotor drive unit
251: Charge current limiting circuit
252: Discharge current limiting circuit
300: Main body
300*a*: Main body
300*b*: Main body
301: First port
302: Second port
303: Passage
304*a*: First passage
304*b*: First passage
305*a*: Second passage
305*ba*: Second passage
306: O-ring
310*a*: Valve
310*b*: Valve
311*a*: Valve body
311*b*: Valve body
312*a*: Valve seat
312*b*: Valve body
313*a*: Hole
320: Adjusting spring
330: Diaphragm
340: Spring saucer
350: Connecting rod
360: Small spring
370: Tip
371: Top
372: Inclined surface

The invention claimed is:

1. A valve control device, comprising:
   a rod-shaped rotor configured to move forward or backward in a direction of a rotation axis by rotating the rotor in forward or reverse rotation,
   wherein one end of the rotor is directly or indirectly connected to a valve body, and at least a part of the valve body is positioned in a flow path for fluid,
   wherein the rotor moves in the direction of the rotation axis by rotating the rotor and changes at least one of:
   a relative position of the valve body with respect to a valve seat that is closed by the valve body; and
   a contact force between the valve body and the valve seat;
   a pair of contacts for sandwiching the rotor, wherein relative movement of the pair of contacts rotates the rotor;
   a moving unit comprising a piezoelectric element for causing the pair of contacts to perform relative movement; and
   a drive control unit for controlling at least either one of the relative position of the valve body with respect to the valve seat or the contact force between the valve body and the valve seat by applying a voltage waveform to the piezoelectric element so as to cause the rotor to move forward or backward in the direction of the rotation axis by rotating the rotor in forward or reverse rotation direction by the pair of contacts.

2. The valve control device according to claim 1, wherein the drive control unit causes the rotor to rotate in accordance with an information in which an amount of drive of the pair of contacts corresponding to an amount of rotation of the rotor, and a physical value relevant to the fluid are associated with each other.

3. The valve control device according to claim 1, further comprising a DC power supply for supplying electric power to the piezoelectric element, wherein the drive control unit controls a flow of current between the DC power supply and the piezoelectric element so as to change the voltage waveform of a voltage applied between terminals of the piezoelectric element to at least either one of a sawtooth shape or a trapezoidal shape.

4. The valve control device according to claim 1, comprising a main body having a first connecting portion and a second connecting portion that connect with the flow path, and having a passage through which the first connecting portion connects with the second connecting portion, wherein:
   one end of the rotor is directly or indirectly connected to the valve body in the main body; and
   a change in at least either one of the relative position of the valve body with respect to the valve seat or the contact force between the valve body and the valve seat adjusts at least one of a fluid pressure, a flow rate, and a flow velocity of fluid flowing through the passage.

5. The valve control device according to claim 4, wherein the valve body and the valve seat are a needle valve mechanism that is arranged inside the main body and is capable of being opened or closed.

6. The valve control device according to claim 5, wherein:
   the passage is divided into a first passage and a second passage by the valve seat;
   the valve seat comprises a hole for allowing fluid to flow from the first passage to the second passage;
   the valve body comprises a first end that is directly or indirectly connected to the one end of the rotor, and a second end that is opposite to the first end and is capable of closing the hole;

the drive control unit causes the rotor to move in a direction of the rotation axis by rotating the rotor in forward or reverse rotation direction such that the valve body moves in a direction to close or open the hole, which movement changes at least either one of the relative position of the valve body with respect to the valve seat or the contact force between the valve body and the valve seat so that at least one of the fluid pressure, the flow rate, and the flow velocity is adjusted.

7. The valve control device according to claim 4, wherein:

the passage is divided into a first passage and a second passage by the valve seat, the valve seat comprises a hole for allowing fluid to flow from the first passage to the second passage, the valve body comprises a connecting portion connected to the one end of the rotor via an elastic body, and a closing portion capable of closing the hole, and the drive control unit causes the rotor to move in a direction of the rotation axis by rotating the rotor in forward or reverse rotation direction such that the valve body moves in a direction to close or open the hole, which movement changes the contact force between the valve body and the valve seat so that the fluid pressure is adjusted.

8. The valve control device according to claim 3, wherein the drive control unit comprises:

a charge current limiting circuit connected to the DC power supply, for charging the piezoelectric element with a current, and for limiting the charge current; and a discharge current limiting circuit for discharging a current from the piezoelectric element and for limiting the discharge current, wherein:

the charge current limiting circuit receives, as control inputs, input of a charge operation command signal for demanding a current charge from the DC power supply to the piezoelectric element, and of a charge current limit value command voltage indicative of a limit value of current flowing into the piezoelectric element; and the discharge current limiting circuit receives input, as control inputs, of a discharge operation command signal for demanding a current discharge from the piezoelectric element, and of a discharge current limit value command voltage indicative of a limit value of current flowing out from the piezoelectric element.

9. The valve control device according to claim 8, wherein the charge operation command signal is stopped in response to occurrence of an event that a value of a voltage applied to the piezoelectric element reaches a desired voltage that is below a voltage of the DC power supply.

10. The valve control device according to claim 1, further comprising an inertial moment member fixed coaxially with the rotor, for applying a moment of inertia to the rotor.

11. The valve control device according to claim 10, wherein:

the rotor is caused to rotate in response to occurrence of an event that an acceleration of relative movement of the pair of contacts generates an acceleration of rotational motion in the inertial moment member, and a force generated by the acceleration of the rotational motion is smaller than or equal to a static friction force generated between the rotor and the pair of contacts; and a slip is caused between the rotor and the pair of contacts in response to occurrence of an event that an acceleration of relative movement of the pair of contacts generates an acceleration of rotational motion in the inertial moment member, and a force generated by the acceleration of the rotational motion is larger than a static friction force generated between the rotor and the pair of contacts.

12. The valve control device according to claim 1, further comprising:

a DC power supply; and a switching circuit for charging the piezoelectric element with a current, and for limiting the charge current, wherein the switching circuit applies the voltage waveform to the piezoelectric element by the charge current to the piezoelectric element.

13. The valve control device according to claim 12, wherein the switching circuit comprises:

a charge current limiting circuit connected to the DC power supply, for charging the piezoelectric element with a current, and for limiting the charge current; and a discharge current limiting circuit for discharging a current from the piezoelectric element and for limiting the discharge current, wherein:

the charge current limiting circuit receives, as control inputs, input of a charge operation command signal for demanding a current charge from the DC power supply to the piezoelectric element, and of a charge current limit value command voltage indicative of a limit value of current flowing into the piezoelectric element; and the discharge current limiting circuit receives input, as control inputs, of a discharge operation command signal for demanding a current discharge from the piezoelectric element, and of a discharge current limit value command voltage indicative of a limit value of current flowing out from the piezoelectric element.

14. The valve control device according to claim 13, wherein the charge operation command signal is stopped in response to occurrence of an event that a value of a voltage applied to the piezoelectric element reaches a desired voltage that is below a voltage of the DC power supply.

15. The valve control device according to claim 12, wherein the rotor is caused to rotate in accordance with an information in which an amount of drive of the pair of contacts corresponding to an amount of rotation of the rotor, and a physical value relevant to the fluid are associated with each other.

16. The valve control device according to claim 1, wherein the voltage waveform has a rising slope and a falling slope different from the rising slope, and wherein the drive control unit causes the rotor to rotate in forward or reverse rotation direction, wherein a gentler one of the rising slope or the falling slope causes the pair of contacts to rotate the rotor, and a steeper one of the rising slope or the falling slope causes a slip between the rotor and the pair of contacts.

17. The valve control device according to claim 12, wherein the voltage waveform has a rising slope and a falling slope different from the rising slope, and wherein the drive control unit causes the rotor to rotate in forward or reverse rotation direction, wherein a gentler one of the rising slope or the falling slope causes the pair of contacts to rotate the rotor, and a steeper one of the rising slope or the falling slope causes a slip between the rotor and the pair of contacts.

18. A fluid control device, comprising:

a plurality of piezoelectric inertial rotation mechanisms, each of which comprises:

a rod-shaped rotor provided so as to rotate about a rotation axis and move forward or backward in a direction of the rotation axis by forward or reverse rotation, wherein one end of the rotor is directly or indirectly connected to a valve body, at least a part of the valve body being positioned in a flow path for fluid, wherein the rotor moves in the direction of the rotation axis by rotating the rotor and changes at least either one of a relative position of the valve body with respect to a valve seat that is closed by the valve body or a contact force between the valve body and the valve seat;

a pair of contacts for sandwiching the rotor, wherein relative movement of the pair of contacts rotates the rotor; and a moving unit comprising a piezoelectric element for causing the pair of contacts to perform relative movement;

a drive control unit for controlling, for each of the plurality of piezoelectric inertial rotation mechanisms, at least either one of the relative position of the valve body with respect to the valve seat by applying a voltage waveform to the piezoelectric element so as to cause the rotor to move in the direction of the rotation axis by rotating the rotor in forward or reverse rotation direction by the pair of contacts; and an air cylinder comprising a main body to which the plurality of piezoelectric inertial rotation mechanisms are attached, and a piston portion arranged in the main body, wherein movement of the piston portion is controlled by changing at least either one of the relative position of the valve body with respect to the valve seat or the contact force between the valve body and the valve seat.

19. The fluid control device according to claim 18, wherein the voltage waveform has a rising slope and a falling slope different from the rising slope, and wherein the drive control unit causes the rotor to rotate in forward or reverse rotation direction, wherein a gentler one of the rising slope or the falling slope causes the pair of contacts to rotate the rotor, and a steeper one of the rising slope or the falling slope causes a slip between the rotor and the pair of contacts.

* * * * *